(12) United States Patent
Lee et al.

(10) Patent No.: US 8,035,213 B2
(45) Date of Patent: Oct. 11, 2011

(54) CHIP PACKAGE STRUCTURE AND METHOD OF MANUFACTURING THE SAME

(75) Inventors: Chang-Chi Lee, Kaohsiung (TW); Shih-Kuang Chen, Kaohsiung (TW); Yuan-Ting Chang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 15 days.

(21) Appl. No.: 12/285,268

(22) Filed: Oct. 1, 2008

(65) Prior Publication Data

US 2009/0102066 A1 Apr. 23, 2009

(30) Foreign Application Priority Data

Oct. 22, 2007 (TW) .............................. 96139548 A

(51) Int. Cl.
*H01L 23/12* (2006.01)
*H01L 21/48* (2006.01)

(52) U.S. Cl. ........ 257/692; 257/693; 257/698; 257/787; 257/E23.011; 257/686; 257/737; 438/125; 438/126; 438/127; 438/667

(58) Field of Classification Search .................. 438/112, 438/124, 126, 127, 125, 667; 257/693, 698, 257/787, 784, E23.011, 686, 737, 692, 773
See application file for complete search history.

(56) References Cited

U.S. PATENT DOCUMENTS

| | | | |
|---|---|---|---|
| 3,959,874 A * | 6/1976 | Coucoulas ...................... 29/856 |
| 4,246,595 A | 1/1981 | Noyori et al. |
| 4,630,096 A | 12/1986 | Drye et al. |
| 4,783,695 A | 11/1988 | Eichelberger et al. |
| 4,827,328 A | 5/1989 | Ozawa et al. |
| 4,860,166 A | 8/1989 | Nicholls |
| 4,907,062 A | 3/1990 | Fukushima |
| 5,019,535 A | 5/1991 | Wojnarowski et al. |
| 5,049,980 A | 9/1991 | Saito et al. |
| 5,091,769 A | 2/1992 | Eichelberger |
| 5,111,278 A | 5/1992 | Eichelberger |
| 5,120,678 A * | 6/1992 | Moore et al. .................... 29/840 |
| 5,149,662 A | 9/1992 | Eichelberger |
| 5,151,776 A | 9/1992 | Wojnarowski et al. |

(Continued)

OTHER PUBLICATIONS

Chiu et al., U.S. Appl. No. 12/622,393 filed Nov. 19, 2009 for "Wafer-Level Semiconductor Device Packages with Electromagnetic Interference Shielding".

(Continued)

*Primary Examiner* — Mary Wilczewski
(74) *Attorney, Agent, or Firm* — Cooley LLP

(57) ABSTRACT

A chip package structure and a method of manufacturing the same are provided. The chip package structure includes a package portion and a plurality of external conductors. The package portion includes a distribution layer, a chip, a plurality internal conductors and a sealant. The distribution layer has a first surface and a second surface, and the chip is disposed on the first surface. Each internal conductor has a first terminal and a second terminal. The first terminal is disposed on the first surface. The sealant is disposed on the first surface for covering the chip and partly encapsulating the internal conductors, so that the first terminal and the second terminal of each internal conductor are exposed from the sealant. The external conductors disposed on the second surface of the distribution layer of the package portion are electrically connected to the internal conductors.

20 Claims, 11 Drawing Sheets

U.S. PATENT DOCUMENTS

| | | | |
|---|---|---|---|
| 5,157,589 A | 10/1992 | Cole, Jr. et al. | |
| 5,225,023 A | 7/1993 | Wojnarowski et al. | |
| 5,241,456 A | 8/1993 | Marcinkiewicz et al. | |
| 5,250,843 A | 10/1993 | Eichelberger | |
| 5,315,486 A | 5/1994 | Fillion et al. | |
| 5,324,687 A | 6/1994 | Wojnarowski | |
| 5,353,195 A | 10/1994 | Fillion et al. | |
| 5,353,498 A | 10/1994 | Fillion et al. | |
| 5,422,513 A | 6/1995 | Marcinkiewicz et al. | |
| 5,432,677 A | 7/1995 | Mowatt et al. | |
| 5,519,936 A * | 5/1996 | Andros et al. | 29/840 |
| 5,527,741 A | 6/1996 | Cole et al. | |
| 5,546,654 A | 8/1996 | Wojnarowski et al. | |
| 5,554,887 A * | 9/1996 | Sawai et al. | 257/737 |
| 5,567,656 A * | 10/1996 | Chun | 438/112 |
| 5,592,025 A | 1/1997 | Clark et al. | |
| 5,600,181 A | 2/1997 | Scott et al. | |
| 5,703,400 A | 12/1997 | Wojnarowski et al. | |
| 5,710,062 A * | 1/1998 | Sawai et al. | 438/127 |
| 5,745,984 A | 5/1998 | Cole, Jr. et al. | |
| 5,834,340 A * | 11/1998 | Sawai et al. | 438/126 |
| 5,841,193 A | 11/1998 | Eichelberger | |
| 5,856,705 A | 1/1999 | Ting | |
| 5,866,952 A | 2/1999 | Wojnarowski et al. | |
| 5,874,784 A | 2/1999 | Aoki et al. | |
| 5,990,546 A | 11/1999 | Igarashi et al. | |
| 5,994,773 A | 11/1999 | Hirakawa | |
| 6,013,953 A | 1/2000 | Nishihara | |
| 6,025,995 A | 2/2000 | Marcinkiewicz | |
| 6,046,071 A * | 4/2000 | Sawai et al. | 438/106 |
| 6,060,775 A | 5/2000 | Ano | |
| 6,080,932 A | 6/2000 | Smith et al. | |
| 6,087,717 A | 7/2000 | Ano et al. | |
| 6,150,767 A | 11/2000 | Huang | |
| 6,154,366 A | 11/2000 | Ma et al. | |
| 6,159,767 A | 12/2000 | Eichelberger | |
| 6,198,165 B1 | 3/2001 | Yamaji et al. | |
| 6,232,151 B1 | 5/2001 | Ozmat et al. | |
| 6,232,661 B1 | 5/2001 | Amagai et al. | |
| 6,239,482 B1 | 5/2001 | Fillion et al. | |
| 6,265,765 B1 | 7/2001 | DiStefano et al. | |
| 6,271,469 B1 | 8/2001 | Ma et al. | |
| 6,294,741 B1 | 9/2001 | Cole, Jr. et al. | |
| 6,306,680 B1 | 10/2001 | Fillion et al. | |
| 6,323,045 B1 | 11/2001 | Cline et al. | |
| 6,331,451 B1 | 12/2001 | Fusaro et al. | |
| 6,358,780 B1 | 3/2002 | Smith et al. | |
| 6,377,461 B1 | 4/2002 | Ozmat et al. | |
| 6,396,148 B1 | 5/2002 | Eichelberger et al. | |
| 6,423,566 B1 | 7/2002 | Feger et al. | |
| 6,423,570 B1 | 7/2002 | Ma et al. | |
| 6,426,545 B1 | 7/2002 | Eichelberger et al. | |
| 6,486,005 B1 | 11/2002 | Kim | |
| 6,486,006 B2 * | 11/2002 | Hirano et al. | 438/125 |
| 6,486,545 B1 | 11/2002 | Glenn et al. | |
| 6,552,430 B1 | 4/2003 | Perez et al. | |
| 6,555,906 B2 | 4/2003 | Wermer et al. | |
| 6,555,908 B1 | 4/2003 | Eichelberger | |
| 6,560,109 B2 | 5/2003 | Yamaguchi et al. | |
| 6,580,159 B1 | 6/2003 | Rodriguez et al. | |
| 6,586,276 B2 | 7/2003 | Towle et al. | |
| 6,586,822 B1 | 7/2003 | Vu et al. | |
| 6,590,291 B2 | 7/2003 | Akagawa | |
| 6,590,295 B1 | 7/2003 | Liao et al. | |
| 6,639,324 B1 | 10/2003 | Chien | |
| 6,646,354 B2 | 11/2003 | Cobbley et al. | |
| 6,656,827 B1 | 12/2003 | Tsao et al. | |
| 6,663,943 B2 | 12/2003 | Kadota | |
| 6,680,529 B2 | 1/2004 | Chen et al. | |
| 6,701,614 B2 | 3/2004 | Ding et al. | |
| 6,706,554 B2 | 3/2004 | Ogura | |
| 6,707,137 B2 | 3/2004 | Kim | |
| 6,709,896 B1 | 3/2004 | Cobbley et al. | |
| 6,709,898 B1 | 3/2004 | Ma et al. | |
| 6,713,859 B1 | 3/2004 | Ma | |
| 6,717,061 B2 | 4/2004 | Yamaguchi et al. | |
| 6,724,638 B1 | 4/2004 | Inagaki et al. | |
| 6,734,370 B2 | 5/2004 | Yamaguchi et al. | |
| 6,734,534 B1 | 5/2004 | Vu et al. | |
| 6,734,696 B2 | 5/2004 | Horner et al. | |
| 6,747,348 B2 | 6/2004 | Jeung et al. | |
| 6,750,547 B2 | 6/2004 | Jeung et al. | |
| 6,756,671 B2 | 6/2004 | Lee et al. | |
| 6,787,894 B2 | 9/2004 | Jeung et al. | |
| 6,790,706 B2 | 9/2004 | Jeung et al. | |
| 6,818,544 B2 | 11/2004 | Eichelberger et al. | |
| 6,838,776 B2 | 1/2005 | Leal et al. | |
| 6,845,554 B2 | 1/2005 | Frankowsky et al. | |
| 6,894,399 B2 | 5/2005 | Vu et al. | |
| 6,902,950 B2 | 6/2005 | Ma et al. | |
| 6,905,914 B1 | 6/2005 | Huemoeller et al. | |
| 6,921,683 B2 * | 7/2005 | Nakayama | 438/122 |
| 6,921,975 B2 | 7/2005 | Leal et al. | |
| 6,953,708 B2 | 10/2005 | Hedler et al. | |
| 6,964,889 B2 | 11/2005 | Ma et al. | |
| 6,977,348 B2 | 12/2005 | Ho et al. | |
| 6,991,966 B2 | 1/2006 | Tuominen | |
| 7,002,245 B2 | 2/2006 | Huang et al. | |
| 7,015,075 B2 | 3/2006 | Fay et al. | |
| 7,019,406 B2 | 3/2006 | Huang et al. | |
| 7,048,450 B2 | 5/2006 | Beer et al. | |
| 7,067,356 B2 | 6/2006 | Towle et al. | |
| 7,071,024 B2 | 7/2006 | Towle et al. | |
| 7,078,788 B2 | 7/2006 | Vu et al. | |
| 7,091,595 B2 | 8/2006 | Fuergut et al. | |
| 7,102,807 B2 | 9/2006 | Shi et al. | |
| 7,112,467 B2 | 9/2006 | Eichelberger et al. | |
| 7,132,312 B2 | 11/2006 | Huang et al. | |
| 7,163,843 B2 * | 1/2007 | Kiendl et al. | 438/114 |
| 7,170,152 B2 | 1/2007 | Huang et al. | |
| 7,176,567 B2 | 2/2007 | Yang et al. | |
| 7,185,426 B1 | 3/2007 | Hiner et al. | |
| 7,192,807 B1 | 3/2007 | Huemoeller et al. | |
| 7,196,408 B2 | 3/2007 | Yang et al. | |
| 7,205,674 B2 | 4/2007 | Huang et al. | |
| 7,224,061 B2 | 5/2007 | Yang et al. | |
| 7,238,602 B2 | 7/2007 | Yang et al. | |
| 7,247,523 B1 | 7/2007 | Huemoeller et al. | |
| 7,262,081 B2 | 8/2007 | Yang et al. | |
| 7,276,783 B2 | 10/2007 | Goller et al. | |
| 7,294,529 B2 | 11/2007 | Tuominen | |
| 7,294,791 B2 * | 11/2007 | Danoski et al. | 174/261 |
| 7,338,884 B2 | 3/2008 | Shimoto et al. | |
| 7,339,279 B2 | 3/2008 | Yang | |
| 7,342,296 B2 | 3/2008 | Yang et al. | |
| 7,344,917 B2 | 3/2008 | Gautham | |
| 7,361,987 B2 | 4/2008 | Leal et al. | |
| 7,364,944 B2 | 4/2008 | Huang et al. | |
| 7,416,918 B2 | 8/2008 | Ma | |
| 7,416,920 B2 | 8/2008 | Yang et al. | |
| 7,420,272 B1 | 9/2008 | Huemoeller et al. | |
| 7,420,273 B2 | 9/2008 | Liu et al. | |
| 7,423,340 B2 | 9/2008 | Huang et al. | |
| 7,425,464 B2 | 9/2008 | Fay et al. | |
| 7,445,957 B2 | 11/2008 | Huang et al. | |
| 7,453,148 B2 | 11/2008 | Yang et al. | |
| 7,459,781 B2 | 12/2008 | Yang et al. | |
| 7,476,563 B2 | 1/2009 | Mangrum et al. | |
| 7,482,198 B2 | 1/2009 | Bauer et al. | |
| 7,501,310 B2 | 3/2009 | Yang et al. | |
| 7,514,767 B2 | 4/2009 | Yang | |
| 7,525,185 B2 | 4/2009 | Yang et al. | |
| 7,557,437 B2 | 7/2009 | Yang et al. | |
| 7,572,681 B1 | 8/2009 | Huemoeller et al. | |
| 7,575,173 B2 | 8/2009 | Fuergut et al. | |
| 7,576,425 B2 | 8/2009 | Liu | |
| 7,588,951 B2 | 9/2009 | Mangrum et al. | |
| 7,595,226 B2 | 9/2009 | Lytle et al. | |
| 7,612,295 B2 | 11/2009 | Takada et al. | |
| 7,618,846 B1 | 11/2009 | Pagaila et al. | |
| 7,619,304 B2 | 11/2009 | Bauer et al. | |
| 7,619,901 B2 | 11/2009 | Eichelberger et al. | |
| 7,622,733 B2 | 11/2009 | Fuergut et al. | |
| 7,629,186 B2 | 12/2009 | Siaudeau | |
| 7,629,199 B2 | 12/2009 | Huang et al. | |
| 7,642,128 B1 | 1/2010 | Lin et al. | |
| 7,655,501 B2 | 2/2010 | Yang et al. | |

| | | |
|---|---|---|
| 7,667,318 B2 | 2/2010 | Yang et al. |
| 7,671,466 B2 | 3/2010 | Pu et al. |
| 7,675,170 B2 | 3/2010 | Formosa |
| 7,692,286 B1 | 4/2010 | Huemoeller et al. |
| 7,714,431 B1 | 5/2010 | Huemoeller et al. |
| 7,732,242 B2 | 6/2010 | Brunnbauer et al. |
| 7,741,151 B2 | 6/2010 | Amrine et al. |
| 7,741,156 B2 | 6/2010 | Pagaila et al. |
| 7,750,467 B2 | 7/2010 | Pu et al. |
| 7,759,163 B2 | 7/2010 | Kroeninger et al. |
| 7,763,494 B2 | 7/2010 | Yang et al. |
| 7,763,976 B2 | 7/2010 | Tang et al. |
| 7,767,495 B2 | 8/2010 | Fuergut et al. |
| 7,767,496 B2 | 8/2010 | Shim et al. |
| 7,772,081 B2 | 8/2010 | Lin et al. |
| 7,790,503 B2 | 9/2010 | Lin et al. |
| 7,790,576 B2 | 9/2010 | Bathan et al. |
| 7,799,602 B2 | 9/2010 | Pagaila et al. |
| 7,812,434 B2 | 10/2010 | Yang |
| 2002/0158334 A1 | 10/2002 | Vu et al. |
| 2003/0077871 A1 | 4/2003 | Cheng et al. |
| 2004/0155352 A1 | 8/2004 | Ma |
| 2006/0284300 A1 | 12/2006 | Nishizawa et al. |
| 2007/0059866 A1 | 3/2007 | Yang et al. |
| 2007/0108580 A1 | 5/2007 | Goller |
| 2007/0170582 A1 | 7/2007 | Nomura et al. |
| 2007/0246806 A1 | 10/2007 | Ong et al. |
| 2007/0252481 A1 | 11/2007 | Iwamoto et al. |
| 2007/0296065 A1 | 12/2007 | Yew et al. |
| 2008/0085572 A1 | 4/2008 | Yang |
| 2008/0105967 A1 | 5/2008 | Yang et al. |
| 2008/0116564 A1 | 5/2008 | Yang et al. |
| 2008/0136002 A1 | 6/2008 | Yang et al. |
| 2008/0136004 A1 | 6/2008 | Yang et al. |
| 2008/0142960 A1 | 6/2008 | Leal et al. |
| 2008/0153209 A1 | 6/2008 | Liu et al. |
| 2008/0153245 A1 | 6/2008 | Lin et al. |
| 2008/0157316 A1 | 7/2008 | Yang et al. |
| 2008/0157327 A1 | 7/2008 | Yang et al. |
| 2008/0157336 A1 | 7/2008 | Yang et al. |
| 2008/0157402 A1 | 7/2008 | Ramakrishna et al. |
| 2008/0174008 A1 | 7/2008 | Yang et al. |
| 2008/0191343 A1 | 8/2008 | Liu et al. |
| 2008/0197469 A1 | 8/2008 | Yang et al. |
| 2008/0197473 A1 | 8/2008 | Chen et al. |
| 2008/0230860 A1 | 9/2008 | Yen et al. |
| 2008/0237879 A1 | 10/2008 | Yang et al. |
| 2008/0246126 A1 | 10/2008 | Bowles et al. |
| 2008/0251908 A1 | 10/2008 | Yang et al. |
| 2008/0258293 A1 | 10/2008 | Yang et al. |
| 2008/0284035 A1 | 11/2008 | Brunnbauer et al. |
| 2008/0303110 A1 | 12/2008 | Lee |
| 2008/0315375 A1 | 12/2008 | Eichelberger et al. |
| 2008/0315377 A1 | 12/2008 | Eichelberger et al. |
| 2008/0315391 A1 | 12/2008 | Kohl et al. |
| 2008/0315404 A1 | 12/2008 | Eichelberger et al. |
| 2009/0014826 A1 | 1/2009 | Chien et al. |
| 2009/0039455 A1 | 2/2009 | Chien et al. |
| 2009/0050995 A1 | 2/2009 | Liu et al. |
| 2009/0050996 A1 | 2/2009 | Liu et al. |
| 2009/0075428 A1 | 3/2009 | Tang et al. |
| 2009/0096093 A1 | 4/2009 | Yang et al. |
| 2009/0096098 A1 | 4/2009 | Yang et al. |
| 2009/0102066 A1* | 4/2009 | Lee et al. ............... 257/784 |
| 2009/0108460 A1 | 4/2009 | Otremba et al. |
| 2009/0127686 A1 | 5/2009 | Yang et al. |
| 2009/0140441 A1 | 6/2009 | Camacho et al. |
| 2009/0140442 A1 | 6/2009 | Lin |
| 2009/0146297 A1 | 6/2009 | Badakere et al. |
| 2009/0155959 A1 | 6/2009 | Lin et al. |
| 2009/0160046 A1 | 6/2009 | Otremba et al. |
| 2009/0160053 A1 | 6/2009 | Meyer et al. |
| 2009/0166785 A1 | 7/2009 | Camacho et al. |
| 2009/0166873 A1 | 7/2009 | Yang et al. |
| 2009/0170242 A1 | 7/2009 | Lin et al. |
| 2009/0176348 A1 | 7/2009 | Griffiths |
| 2009/0221114 A1 | 9/2009 | Xu |
| 2009/0224391 A1 | 9/2009 | Lin et al. |
| 2009/0230542 A1 | 9/2009 | Lin et al. |
| 2009/0236686 A1* | 9/2009 | Shim et al. ............... 257/528 |
| 2009/0236749 A1 | 9/2009 | Otremba et al. |
| 2009/0256247 A1 | 10/2009 | Landau et al. |
| 2009/0261466 A1* | 10/2009 | Pagaila et al. ............. 257/686 |
| 2009/0273075 A1 | 11/2009 | Meyer-Berg |
| 2009/0294899 A1 | 12/2009 | Pagaila et al. |
| 2009/0294911 A1 | 12/2009 | Pagaila et al. |
| 2009/0309212 A1 | 12/2009 | Shim et al. |
| 2010/0001396 A1 | 1/2010 | Meyer et al. |
| 2010/0006330 A1 | 1/2010 | Fu et al. |
| 2010/0006994 A1* | 1/2010 | Shim et al. ............... 257/676 |
| 2010/0007029 A1 | 1/2010 | Do et al. |
| 2010/0013102 A1 | 1/2010 | Tay et al. |
| 2010/0019359 A1 | 1/2010 | Pagaila et al. |
| 2010/0019381 A1 | 1/2010 | Haeberlen et al. |
| 2010/0031500 A1 | 2/2010 | Eichelberger et al. |
| 2010/0032091 A1 | 2/2010 | Eichelberger et al. |
| 2010/0035384 A1 | 2/2010 | Eichelberger et al. |
| 2010/0044855 A1 | 2/2010 | Eichelberger et al. |
| 2010/0047970 A1 | 2/2010 | Eichelberger et al. |
| 2010/0052135 A1 | 3/2010 | Shim et al. |
| 2010/0059853 A1 | 3/2010 | Lin et al. |
| 2010/0059854 A1 | 3/2010 | Lin et al. |
| 2010/0072599 A1* | 3/2010 | Camacho et al. ............ 257/686 |
| 2010/0072618 A1* | 3/2010 | Camacho et al. ............ 257/738 |
| 2010/0140736 A1 | 6/2010 | Lin et al. |
| 2010/0140771 A1 | 6/2010 | Huang et al. |
| 2010/0140779 A1 | 6/2010 | Lin et al. |
| 2010/0200951 A1 | 8/2010 | Lin et al. |
| 2010/0221873 A1 | 9/2010 | Marimuthu et al. |
| 2010/0224983 A1 | 9/2010 | Huang et al. |
| 2010/0233831 A1 | 9/2010 | Pohl et al. |
| 2010/0308449 A1 | 12/2010 | Yang et al. |
| 2010/0314746 A1 | 12/2010 | Hsieh et al. |
| 2010/0320593 A1 | 12/2010 | Weng et al. |
| 2011/0018118 A1 | 1/2011 | Hsieh et al. |
| 2011/0018124 A1 | 1/2011 | Yang et al. |

OTHER PUBLICATIONS

Lee et al., U.S. Appl. No. 12/691,660 filed Jan. 20, 2010 for "Wafer-Level Semiconductor Device Packages with Three-Dimensional Fan-Out and Manufacturing Methods Thereof".

Su et al., U.S. Appl. No. 12/701,486 filed Feb. 5, 2010 for "Embedded Component Substrate and Manufacturing Methods Thereof".

Ding et al., U.S. Appl. No. 12/753,840 filed Apr. 2, 2010 for "Semiconductor Device Packages with Fan-Out and with Connecting Elements for Stacking and Manufacturing Methods Thereof".

Ding et al., U.S. Appl. No. 12/753,837 filed Apr. 2, 2010 for "Wafer-Level Semiconductor Device Packages with Stacking Functionality".

Chen et al., U.S. Appl. No. 12/753,843 filed Apr. 2, 2010 for "Stacked Semiconductor Device Package Assemblies with Reduced Wire Sweep and Manufacturing Methods Thereof".

Su et al., U.S. Appl. No. 13/006,340 filed Jan. 13, 2011 for "Semiconductor Package with Single Sided Substrate Design and Manufacturing Methods Thereof".

Lee et al., U.S. Appl. No. 12/972,046 filed Dec. 17, 2010 for "Embedded Component Device and Manufacturing Methods Thereof".

Weng, et al., U.S. Appl. No. 12/955,782 filed Nov. 29, 2010 for "Semiconductor Package and Manufacturing Methods Thereof".

Hunt et al., U.S. Appl. No. 12/944,697 filed Nov. 11, 2010 for "Wafer Level Semiconductor Package and Manufacturing Methods Thereof".

Chen et al., U.S. Appl. No. 12/874,144 filed Sep. 01, 2010 for "Stackable Semiconductor Package and Manufacturing Method Thereof".

* cited by examiner

CHIP PACKAGE STRUCTURE AND METHOD OF MANUFACTURING THE SAME

This application claims the benefit of Taiwan application Serial No. 96139548, filed Oct. 22, 2007, the subject matter of which is incorporated herein by reference.

BACKGROUND OF THE INVENTION

1. Field of the Invention

The invention relates in general to a package structure and a method of manufacturing the same, and more particularly to a chip package structure and a method of manufacturing the same.

2. Description of the Related Art

In recent years, electronic devices have been widely used in people's everyday life, and the manufacturers are dedicated to the development of miniaturized and multi-function electronic products to meet the market demands. Among the package structures used in the semiconductor components of electronic products, the wafer level chip scale package (WLCSP) is the most commonly used package structure.

Referring to FIG. 1, a conventional chip package portion is shown. The package portion 10 includes a distribution layer 20, a sealant 30, an insulation layer 40, a chip 50, a plurality of internal wires 70 and a plurality of solder balls 90. The sealant 30 encapsulates the insulation layer 40, the chip 50 and the internal wires 70. The sealant 30 is disposed on one side of the distribution layer 20. The solder balls 90 are disposed on the other side of the distribution layer 20. The insulation layer 40 is located between the distribution layer 20 and the chip 50. One terminal of the internal wires 70 is disposed on the chip 50, and the other terminal of the internal wires 70 is connected to the distribution layer 20. The chip 50 is electrically connected to the solder balls 90 by the internal wires 70 via the distribution layer 20.

Due to the restriction on the shape of the internal wires 70, a thickness H30 of the sealant 30 is far larger than a thickness H50 of the chip 50, hence increasing the volume of the package portion 10 and restricting the miniaturization of electronic devices. In order to provide multiple functions, a multi-function electronic device must integrate a plurality of chips within. Thus, how to provide a package portion with increased packaging density and a method of manufacturing the same has become an important direction of the research and development in the semiconductor industry.

SUMMARY OF THE INVENTION

The invention is directed to a chip package structure and a method of manufacturing the same. By using the design of each internal conductor and corresponding external conductors, the thickness of the sealant required by the package portion is reduced so that the density of the package structure is increased.

According to a first aspect of the present invention, a chip package structure including a package portion and a plurality of external conductors is provided. The package portion includes a distribution layer, a chip, a plurality internal conductors and a sealant. The distribution layer has a first surface and a second surface, and the chip is disposed on the first surface. Each internal conductor has a first terminal and a second terminal. The first terminal is disposed on the first surface. The sealant is disposed on the first surface for covering the chip and partly encapsulating the internal conductors, so that the first terminal and the second terminal of each internal conductor are exposed from the sealant. The external conductors disposed on the second surface of the distribution layer of the package portion are electrically connected to the internal conductors.

According to a second aspect of the present invention, a method of manufacturing chip package structure is provided. The manufacturing method includes the following steps: Firstly, a carrier having an adhering layer is provided. Next, a plurality internal conductors and at least one chip are disposed on the adhering layer, wherein each internal conductor has a first terminal and a second terminal, and the first terminal is disposed on the adhering layer. Then, a sealant is formed on the adhering layer to cover the chip and the internal conductors. Afterwards, the adhering layer is removed to expose the first terminal of each internal conductor, an active surface of the chip and a bottom surface of the sealant. In addition, a distribution layer is formed on the bottom surface of the sealant, so that the first terminal of each internal conductor and the active surface of the chip are disposed on a first surface of the distribution layer and electrically connected to the distribution layer to form a package portion, wherein the package portion includes the chip, the internal conductors corresponding to the chip, the distribution layer, and the sealant. Lastly, a plurality of external conductors is disposed on a second surface of the distribution layer.

The invention will become apparent from the following detailed description of the preferred but non-limiting embodiments. The following description is made with reference to the accompanying drawings.

DETAILED DESCRIPTION OF THE INVENTION

First Embodiment

Figure 1:
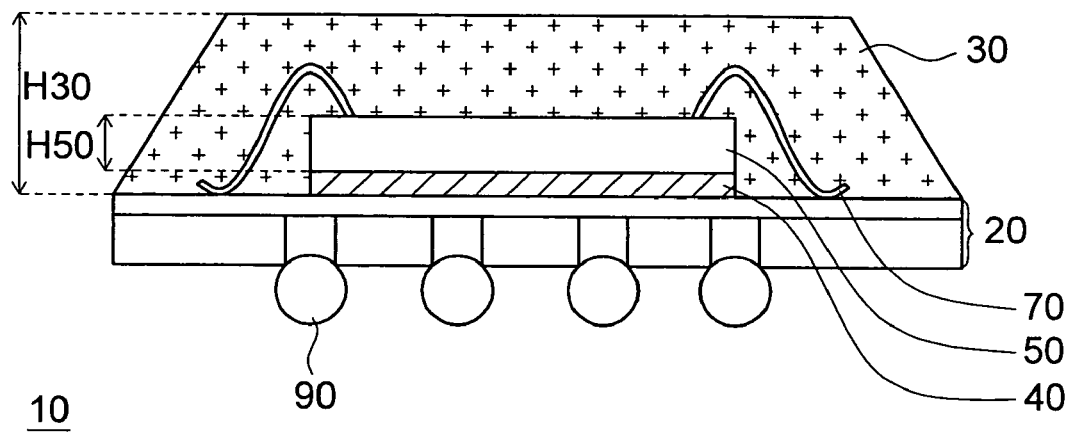
FIG. 1 (Prior Art) shows a conventional chip package portion.
Figure 2:
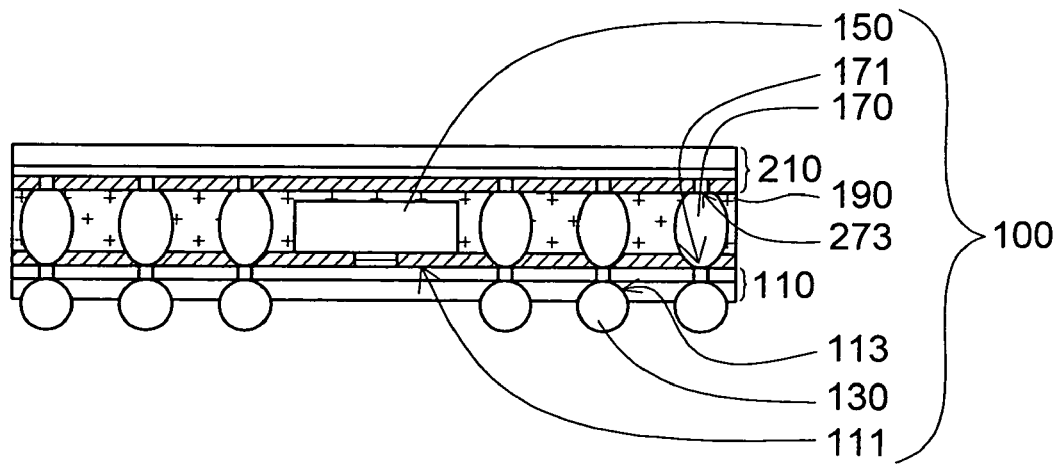
FIG. 2 shows a chip package structure according to a first embodiment of the invention.

Referring to FIG. 2, a chip package structure according to a first embodiment of the invention is shown. The chip package structure includes a first package portion 100 and a plurality of first external conductors 130. The first package portion 100 includes a distribution layer 110, a chip 150, a plurality of internal conductors 170 and a sealant 190.

The distribution layer 110 has a first surface 111 and a second surface 113. The chip 150 is disposed on the first surface 111 of the distribution layer 110. The internal conductors 170 has a first terminal 171 and a second terminal 273, wherein the first terminal 171 is disposed on the first surface 111 of the distribution layer 110. The sealant 190 is disposed on the first surface 111 of the distribution layer 110 for covering the chip 150 and partly encapsulating the internal conductors 170, so that the first terminal 171 and the second terminal 273 of each internal conductor 170 are exposed from the sealant 190. The first external conductors 130 disposed on the second surface 113 of the distribution layer 110 of the first package portion 100 are electrically connected to the internal conductors 170.

The first package portion 100 further includes another distribution layer 210 disposed on the sealant 190 for covering the second terminal 273 of each internal conductor 170. With the disposition of the internal conductors 170 whose thickness is slightly larger than the thickness of chip 150, the required thickness of the sealant 190 is reduced so that the volume of the first package portion 100 is decreased accordingly.

Figure 3A:
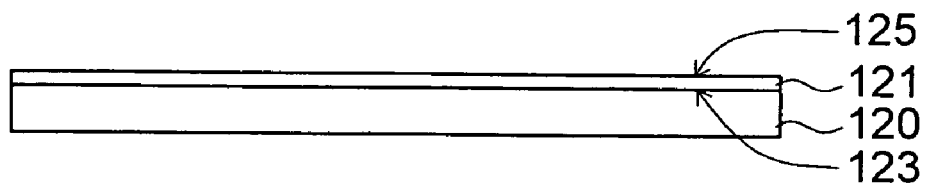
FIGS. 3A~3M show a method of manufacturing the chip package structure of FIG. 2.
Figure 3B:
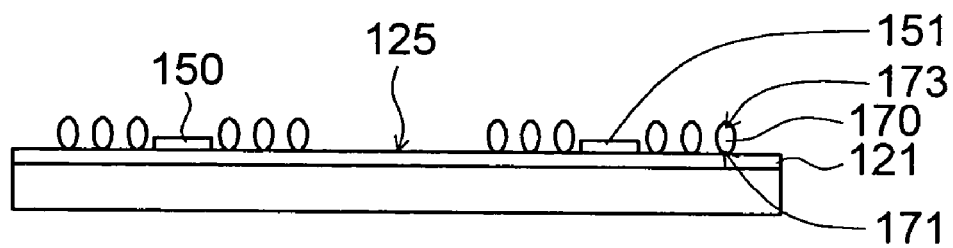
Figure 3C:
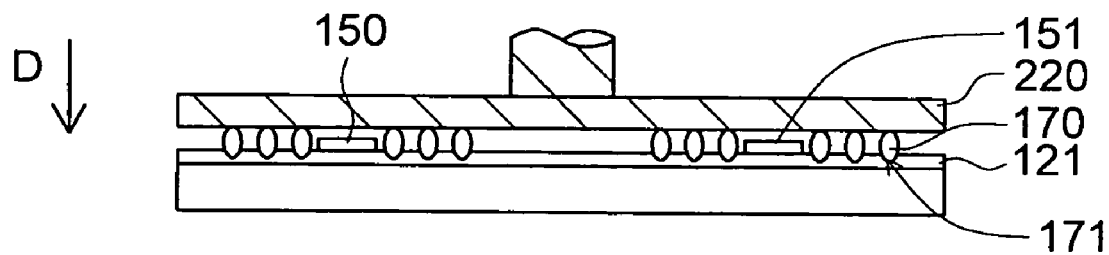
Figure 3D:
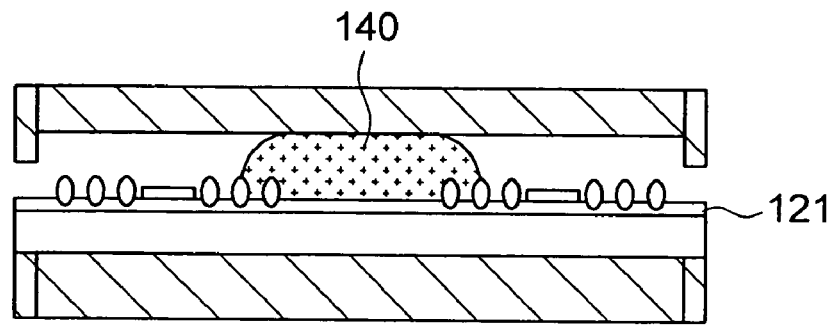
Figure 3E:
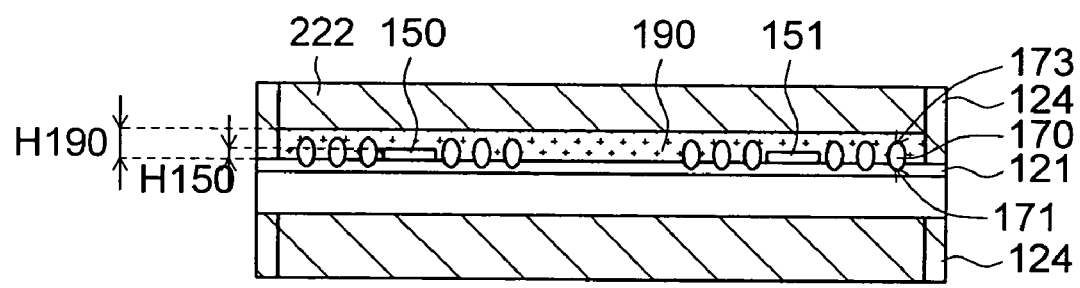
Figure 3F:
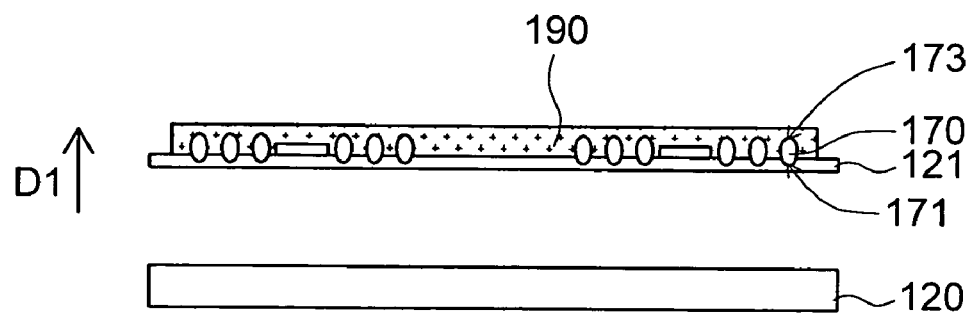
Figure 3G:
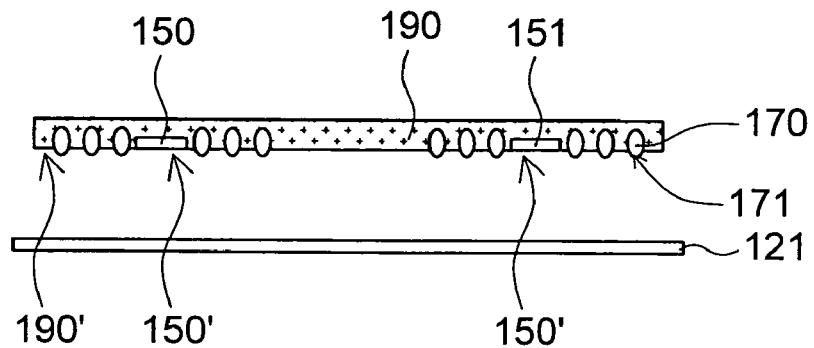
Figure 3H:
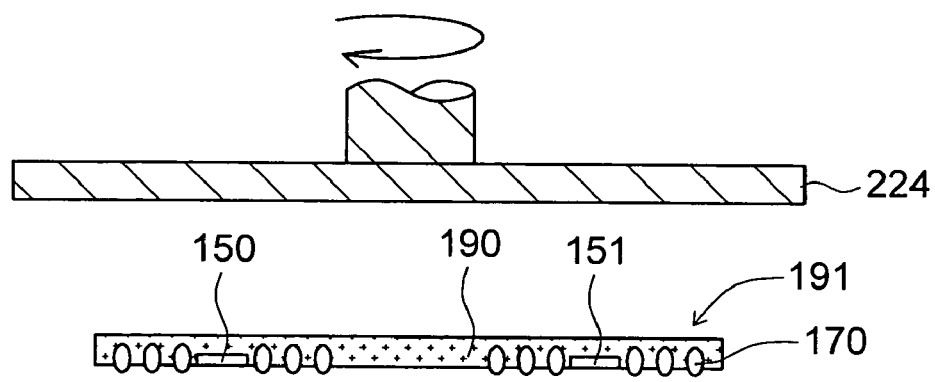
Figure 3I:
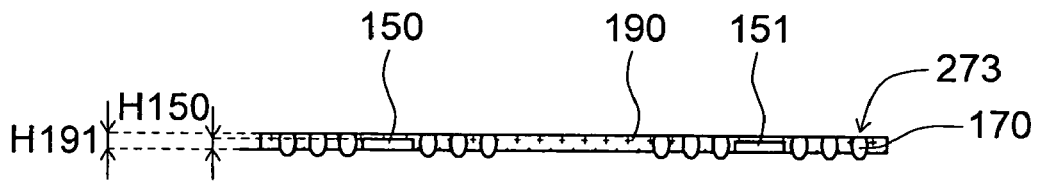
Figure 3J:
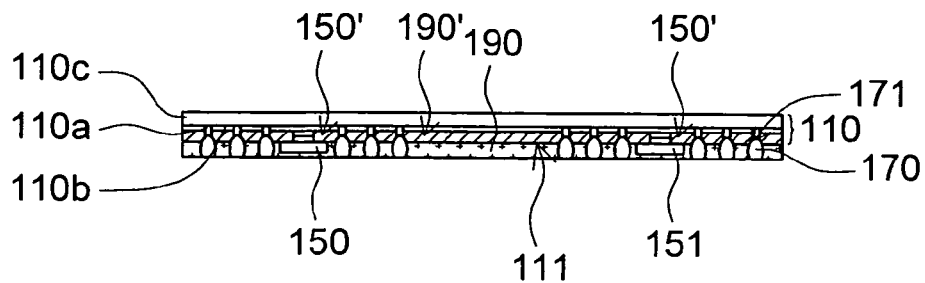
Figure 3K:
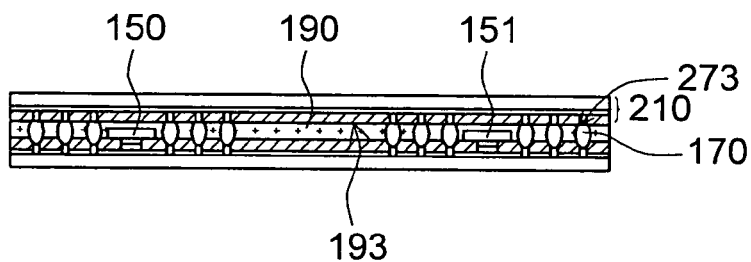
Figure 3L:
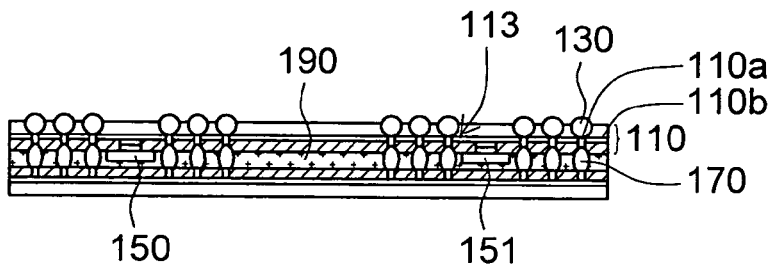
Figure 3M:
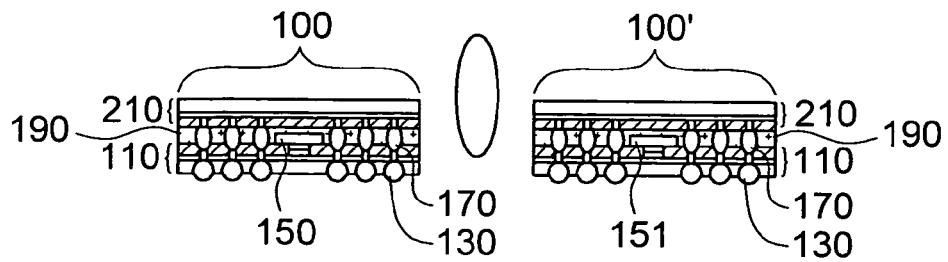
Figure 4:
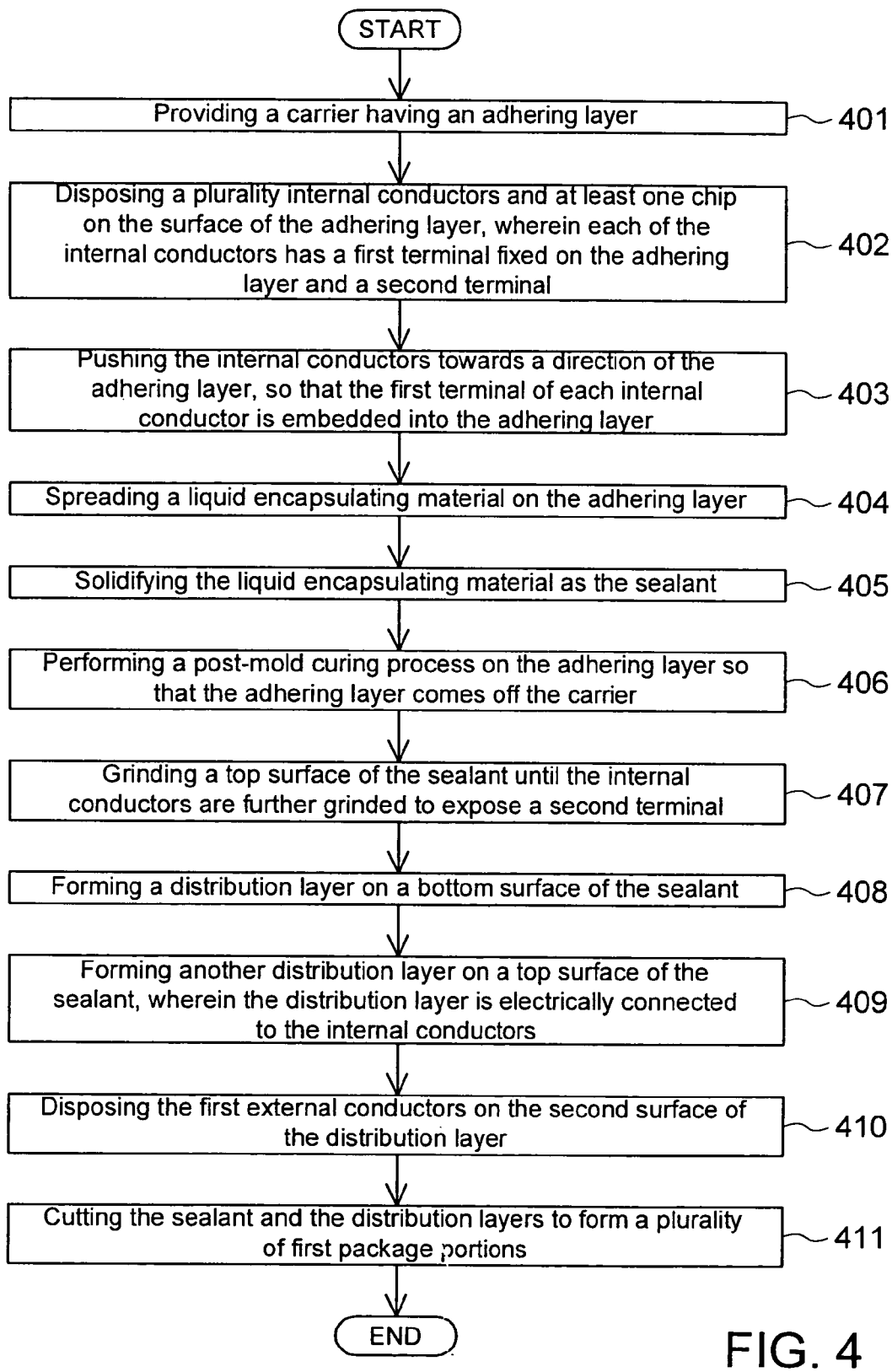
FIG. 4 shows a flowchart of the method of manufacturing the chip package structure in FIG. 2.

Referring to FIGS. 3A~3M and FIG. 4, FIGS. 3A~3M show a method of manufacturing the chip package structure of FIG. 2, and FIG. 4 shows a flowchart of the method of manufacturing the chip package structure in FIG. 2.

The method begins at step 401 as indicated in FIG. 3A, a carrier 120 having an adhering layer 121 is provided. The carrier 120 can be a metallic carrier, the surfaces 123 and 125 of the adhering layer 121 are both adhesive, and the surface 123 of the adhering layer 121 is adhered onto the carrier 120.

Next, the method proceeds to step 402 as indicated in FIG. 3B, a plurality internal conductors 170 and at least one chip are disposed on the surface 125 of the adhering layer 121. In the present embodiment of the invention, the chips 150 and 151 substantially have the same structure. Each of the internal conductors 170 has a first terminal 171 and a second terminal 173, wherein the first terminal 171 of each internal conductor 170 and the chips 150 and 151 are adhered and fixed on the adhering layer 121.

Then, the method proceeds to step 403 as indicated in FIG. 3C, a mold 220 such as a plunger is provided to push the internal conductors 170 towards a direction D of the adhering layer 121, so that the first terminal 171 of each internal conductor 170 is embedded into and fixed on the adhering layer 121, but the mold 220 does not contact the chips 150 and 151. As the internal conductors 170 are pushed into the adhering layer 121, the internal conductors 170 will not move in subsequent processes.

Then, the method proceeds to step 404 as indicated in FIG. 3D, a liquid encapsulating material 140 is spread on the adhering layer 121, wherein the liquid encapsulating material 140 can flow on the adhering layer 121.

Then, the method proceeds to step 405 as indicated in FIG. 3E, another mold 222 is provided to press and heat the liquid encapsulating material 140 (illustrated in FIG. 3D) so that the liquid encapsulating material 140 solidifies as the sealant 190. The sealant 190 covers the chips 150 and 151 and the internal conductors 170. The thickness H190 of the sealant 190 substantially is slightly larger than the thickness H150 of the chips 150 and 151, so that the sealant 190 covers the chips 150 and 151 and partly encapsulates the internal conductors 170. The first terminal 171 of each internal conductor 170 is embedded into the adhering layer 121 and exposed from the sealant 190, but the second terminal 173 of each internal conductor 170 is encapsulated in the sealant 190.

Afterwards, the method proceeds to step 406 as indicated in FIG. 3F, a post-mold curing process is performed on the adhering layer 121, and the adhering layer 121 and the sealant layer 190 are moved along a direction D1 so that the adhering layer 121 comes off the carrier 120. Next, as indicated in FIG. 3G, the sealant 190 comes off the adhering layer 121 to expose the first terminal 171 of each internal conductor 170, an active surface 150' of the chips 150 and 151, and a bottom surface of 190' of the sealant 190.

Next, the method proceeds to step 407 as indicted in FIGS. 3H and 3I, a grinding tool 224 is further provided to grind a top surface 191 of the sealant 190 until touching the second terminal 173 of each internal conductor 170, and the internal conductors 170 are further grinded to expose a second terminal 273 having a larger area so that the electrical connection becomes more stable. The thickness H191 of the sealant after grinding is still larger than the thickness H150 of the chips 150 and 151.

Next, the method proceeds to step 408 as indicted in FIG. 3J, the sealant 190 is turned over to make the bottom surface 190' and the active surface 150' of the chips 150 and 151 face upwards, and the bottom surface 190' of the sealant 190 forms a distribution layer 110, so that the first terminal 171 of each internal conductor 170 and the active surface 150' of the chips 150 and 151 are disposed on the first surface 111 of the distribution layer 110 and electrically connected to the distribution layer 110. The first terminal 171 of each internal conductor 170 is electrically connected to the chips 150 and 151 via the distribution layer 110.

The distribution layer 110 includes an under bump metallurgy (UBM) 110a, a re-distribution layer (RDL) 110b and a polymer layer 110c. The UBM 110a contacts and makes the internal conductors 170 electrically connected to the re-distribution layer 110b. The internal conductors 170 are electrically connected to the chips 150 and 151 via the re-distribution layer 110b. The polymer layer 110c is used for electrical isolation purpose to avoid circuiting. The re-distribution layer 110b can be formed by way of sputtering, and the polymer layer 110c can be pasted on the re-distribution layer 110b.

Then, the method proceeds to step 409 as indicated in FIG. 3K, the sealant 190 is turned over so that a grinded top surface 193 faces upwards and forms another distribution layer 210. The distribution layer 210 is electrically connected to the internal conductors 170 via the connection with the second terminal 273 of each internal conductor 170. The formation of the distribution layer 210 is the same with that of the distribution layer 110, and is not repeated here.

Then, the method proceeds to step 410 as indicated in FIG. 3L, the sealant 190 is turned over, and the first external conductors 130 is disposed on the second surface 113 of the distribution layer 110. The first external conductors 130 contact the UBM 110a or the re-distribution layer 110b, so that the first external conductors 130 are electrically connected to the chips 150 and 151 via the internal conductors 170 and the distribution layer 110.

Then, the method proceeds to step 411 as indicated in FIG. 3M, the sealant 190 is turned over, and the sealant 190 and the distribution layers 110 and 210 are cut to form a plurality of first package portions 100 and 100'. The first package portion 100 includes the chip 150, the internal conductors 170 corresponding to the chip 150, the distribution layers 110 and 210, the sealant 190 and the first external conductors 130. The first package portion 100' includes the chip 151, the internal conductors 170 corresponding to the chip 151, the distribution layers 110 and 210, the sealant 190 and the first external conductors 130.

For the chip package structure which is manufactured according to the above method, the chips 150 and 151 corresponding to the first package portions 100 and 100' are electrically connected to the active surface 150' via the internal conductors 170 and the distribution layer 110, and each of the chips 150 and 151 has an external conductor 130 and can be disposed on other electronic components.

Further, the chip package structure of the invention can be formed by stacking a plurality of package portions. The stacked package portions can have the same or different structures.

Figure 5:
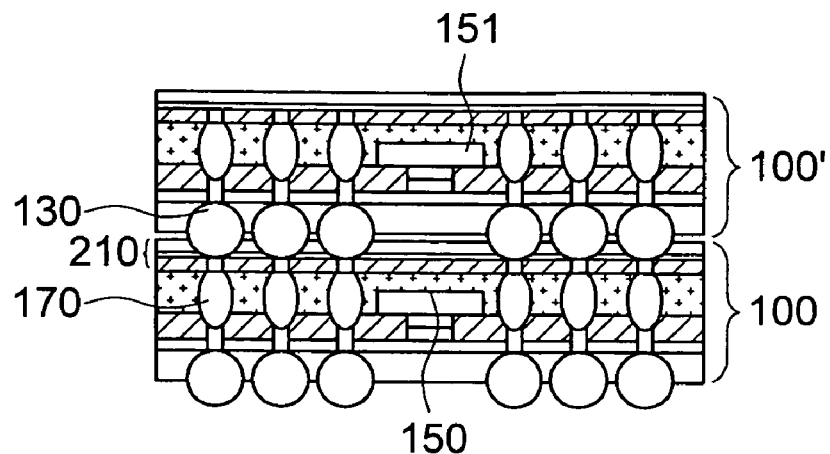
FIG. 5 shows two identical package portions stacked together.

Referring to FIG. 5, two identical package portions stacked together is shown. The first package portion 100 and the first package portion 100' have the same structure and the same size. The first external conductors 130 corresponding to the chip 151 are connected to the distribution layer 210 of the first package portion 100, so that the first package portion 100 and the first package portion 100' are electrically connected together via the first external conductors 130 to form a stacked chip package structure. Moreover, if the stacked package structure is formed by stacking over two identical package portions, the first external conductor 130 of the first package portion 100' disposed atop can be directly connected to the internal conductor 170 of the first package portion 100 disposed underneath, hence omitting the distribution layer 210 of the first the package structure 100.

Figure 6:
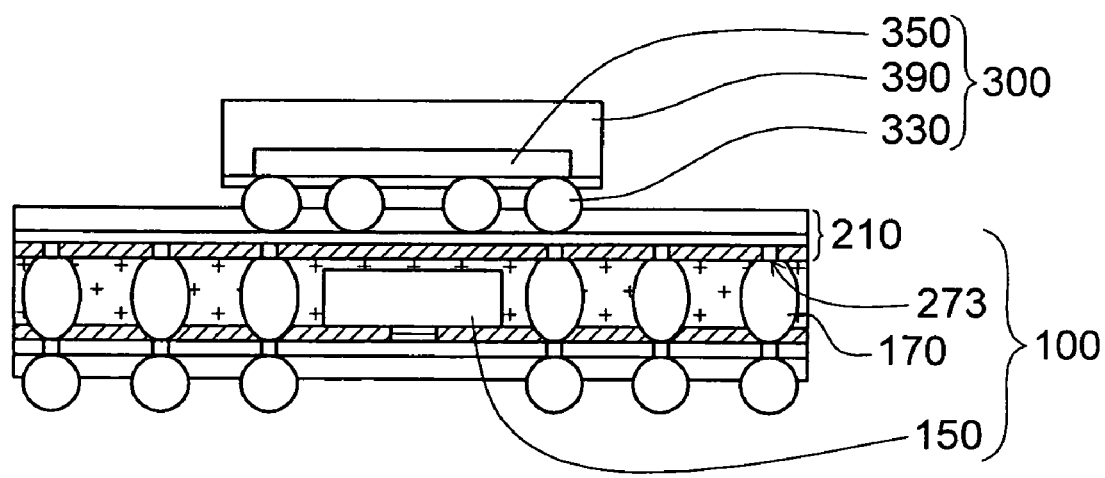
FIG. 6 shows two different package portions stacked together.

Referring to FIG. 6, two different package portions stacked together is shown. The first package portion 100 and the second package portion 300 have different sizes and structures. A plurality of second external conductors 330 and the second package portion 300 are disposed above the distribution layer 210 of the first package portion 100, so that the second package portion 300 is electrically connected to the second terminal 273 of each internal conductor 170 via the second external conductors 330. The second package portion 300 further includes another chip 350 encapsulated by a sealant 390. The chip 350 is electrically connected to the second external conductors 330. The chip 150 and the chip 350 substantially have different structures. The second external conductors 330 contacting the distribution layer 210 are electrically connected to the second terminal 273 of each internal conductor 170 via the distribution layer 210, so that the chip 150 of the first package portion 100 and the chip 350 of the second package portion 300 which have different structures can be electrically connected together to form a stacked chip package structure.

The chip package structure exemplified in the present embodiment of the invention can be used in a 3 dimensional fan-out wafer level chip scale package (WLCSP). The internal conductors 170, the first external conductors 130 and the second external conductors 330 can be a plurality of solder balls. There is no restriction about the shape and the size of the internal conductors 170, and the thickness of each internal conductor 170 encapsulated by the sealant 190 is preferably slightly larger than the thickness H150 of the chip 150. With the disposition of the internal conductors 170, the first package portion 100 can reduce the required thickness of the sealant 190 and decrease the volume of the first package portion 100. When the chip package structure is formed by stacking different package portions, the second package portion 300 is formed on the sealant 190 via the distribution layer 210 of the first package portion 100 for electrically connecting the two package portions. Thus, the second external conductors 330 do not need to correspond to the internal conductors 170, and the second package portion 300 can have any size or shape, hence increasing the adaptability of the chip package structure.

Second Embodiment

Referring to FIGS. 7A~7L, a method of manufacturing the chip package structure according to a second embodiment of the invention is shown.

Figure 7A:
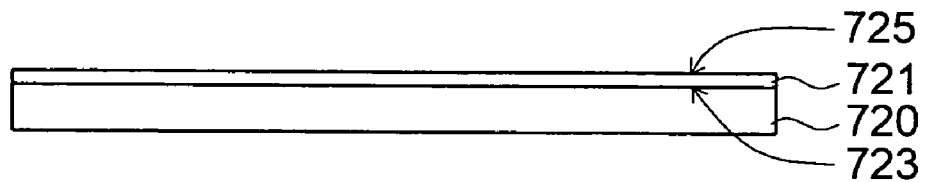
FIGS. 7A~7L show a method of manufacturing the chip package structure according to a second embodiment of the invention.

As indicated in FIG. 7A, a metallic carrier 720 having an adhering layer 721 disposed thereon is provided. The surfaces 723 and 725 of the adhering layer 721 are both adhesive, and the surface 723 of the adhering layer 721 is adhered on the metallic carrier 720.

Figure 7B:
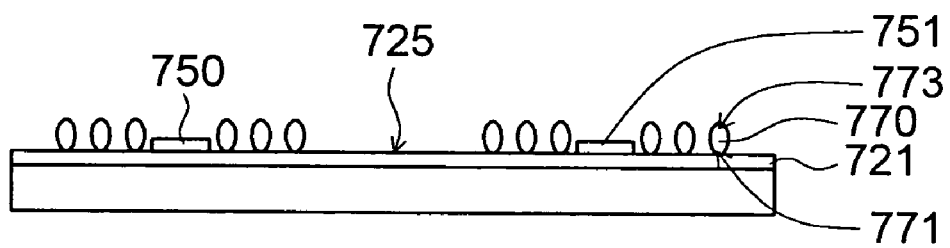

As indicated in FIG. 7B, the surface 725 of the adhering layer 721 forms a plurality internal conductors 770 and at least one chip. In the present embodiment of the invention, two chips 750 and 751 are used. The chips 750 and 751 substantially have the same structure. The internal conductors 770 are respectively disposed on the two sides of the chips 750 and 751. Each internal conductor 770 has a first terminal 771 and a second terminal 773, and the first terminal 771 is disposed on the adhering layer 721.

Figure 7C:
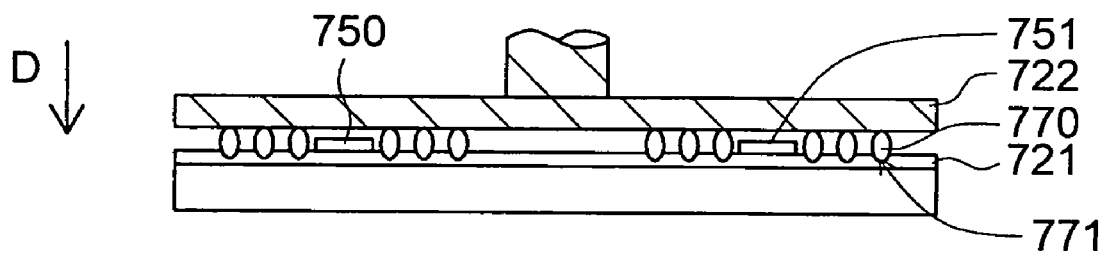

Next, as indicated in FIG. 7C, a plunger 722 is provided to push the internal conductors 770 towards a direction D of the adhering layer 721, so that the first terminal 771 of each internal conductor 770 is embedded into and fixed on the adhering layer 721. The plunger 722 does not contact the chips 750 and 751.

Figure 7D:
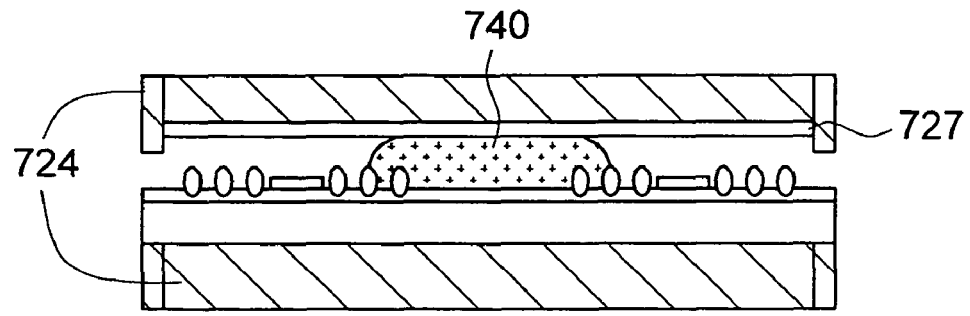

Then, as indicated in FIG. 7D, a liquid encapsulating material 740 is spread on the adhering layer 721, and a mold 724 is provided. The liquid encapsulating material 740 can flow on the adhering layer 721. The mold 724 has another adhering layer 727.

Figure 7E:
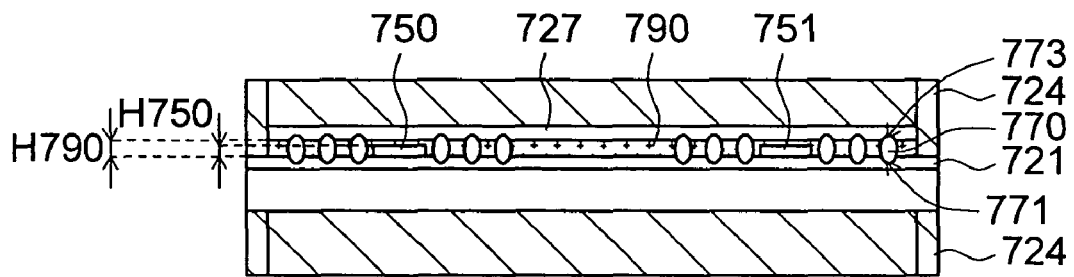

Afterwards, as indicated in FIG. 7E, the mold 724 is used to press and heat the liquid encapsulating material 740 (illustrated in FIG. 7D), so that the second terminal 773 of each internal conductor 770 is embedded into the adhering layer 727. The first terminal 771 of each internal conductor 770 can be concurrently embedded into the adhering layer 721. The liquid encapsulating material 740 is pressed and heated by the mold 724 and solidifies to be the sealant 790 for covering the chips 750 and 751 and internal conductors 770. A thickness H790 of the sealant 790 is substantially slightly larger than a thickness H750 of the chips 750 and 751, so that the sealant 790 covers the chips 750 and 751 and partly encapsulates the internal conductors 770. The first terminal 771 and the second terminal 773 of each internal conductor 770 are exposed from the sealant 790.

Figure 7F:
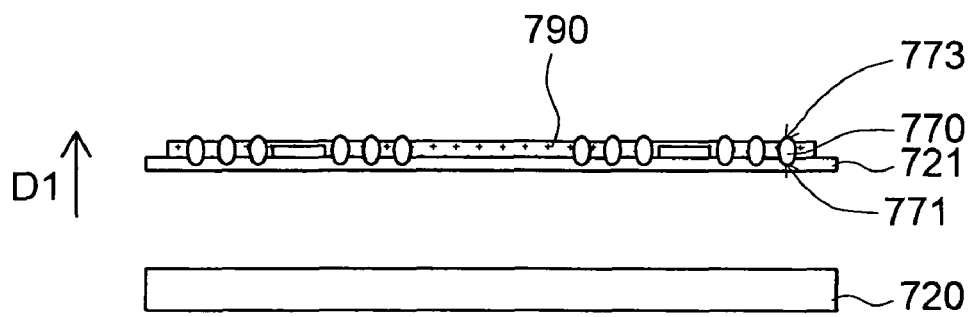

Then, as indicated in FIG. 7F, a post-mold curing process is performed on the adhering layer 721, and the adhering layer 721 and the sealant layer 790 are removed along the direction D1 so that the adhering layer 721 comes off the metallic carrier 720. The adhering layer 727 is also removed along with the mold 724 to expose the second terminal 773 of each internal conductor 770.

Figure 7G:
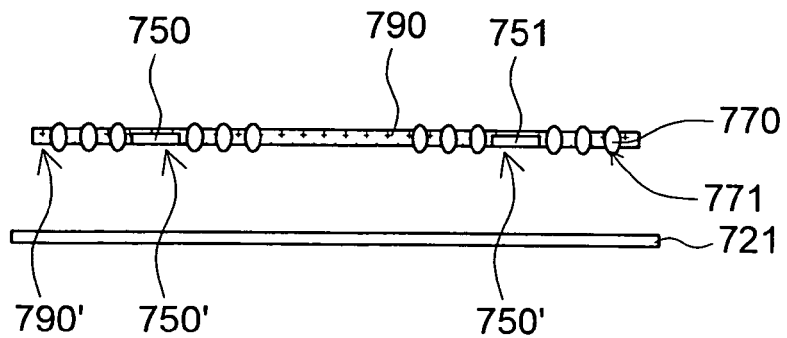

Next, as indicated in FIG. 7G, the adhering layer 721 is removed to expose the first terminal 771 of each internal conductor 770, an active surface 750' of the chips 750 and 751, and a bottom surface of 790' of the sealant 790.

Figure 7H:
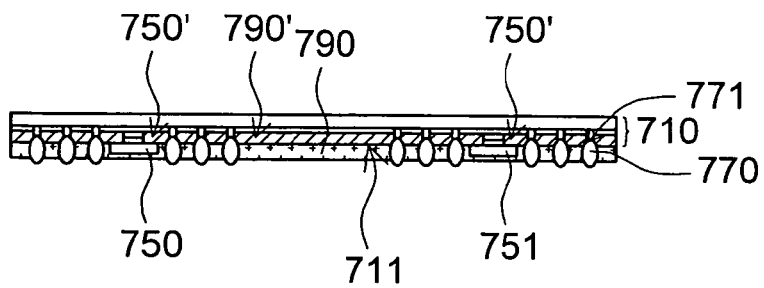

After that, as indicated in FIG. 7H, the sealant 790 is turned over and makes the bottom surface 790' of the sealant 790 and the active surface 750' of the chips 750 and 751 face upwards, and the bottom surface 790' of the sealant 790 forms the distribution layer 710, so that the first terminal 771 of each internal conductor 770 and the chips 750 and 751 are disposed on a first surface of 711 of the distribution layer 710 and electrically connected to the distribution layer 710. The internal conductors 770 disposed on two sides of the chips 750 and 751 are respectively electrically connected to the corresponding chips 750 and 751 by connecting the first terminal 771 to the distribution layer 110.

Figure 7I:
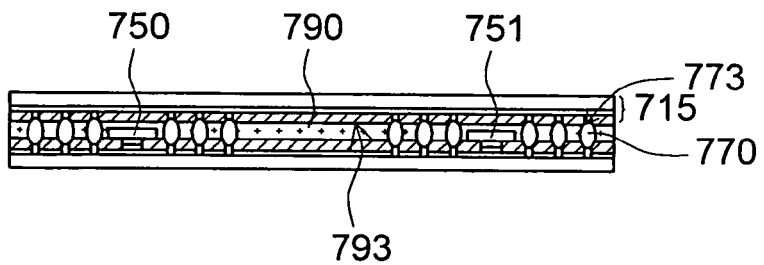

Then, as indicated in FIG. 7I, the sealant 790 is turned over so that a top surface 793 of the sealant 790 faces upwards and forms another distribution layer 715. The distribution layer 715 is electrically connected to the internal conductors 770 and the chips 750 and 751 via the connection with the second terminal 773 of each internal conductor 770.

Figure 7J:
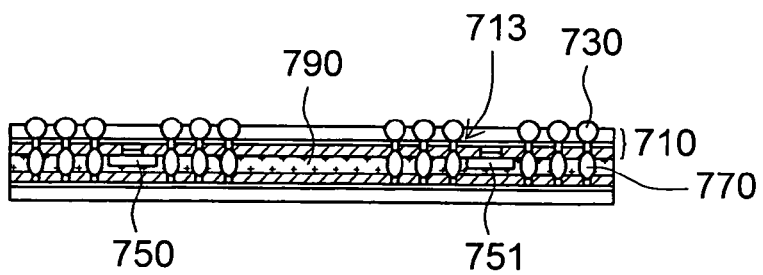

Afterwards, as indicated in FIG. 7J, the sealant layer 790 is turned over so that the distribution layer 710 face upwards and a plurality of first external conductors 730 are disposed on a second surface of 713 of the distribution layer 710. The first external conductors 730 are electrically connected to the chips 750 and 751 via the internal conductors 770 and the distribution layer 710.

Figure 7K:
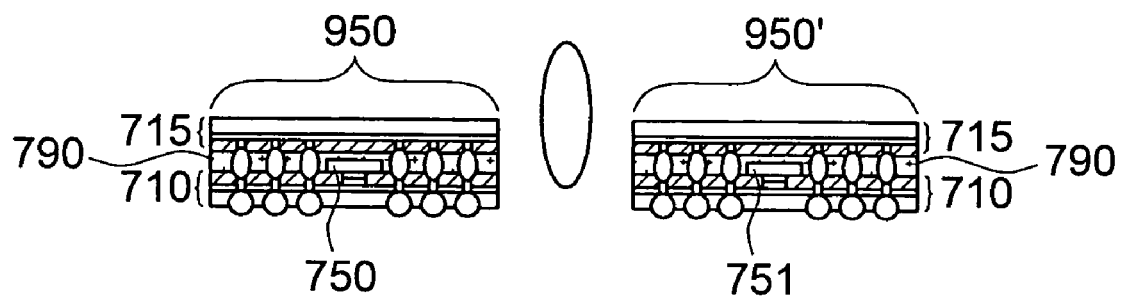

Then, as indicated in FIG. 7K, the sealant 790 and the distribution layers 710 and 715 are cut to form a plurality of first package portions 950 and 950'. The first package portion 950 includes the chip 750, the internal conductors corresponding to the chip 750, and the first external conductors. The first package portion 950' includes the chip 751, the internal conductors corresponding to the chip 751, and the first external conductors.

Figure 7L:
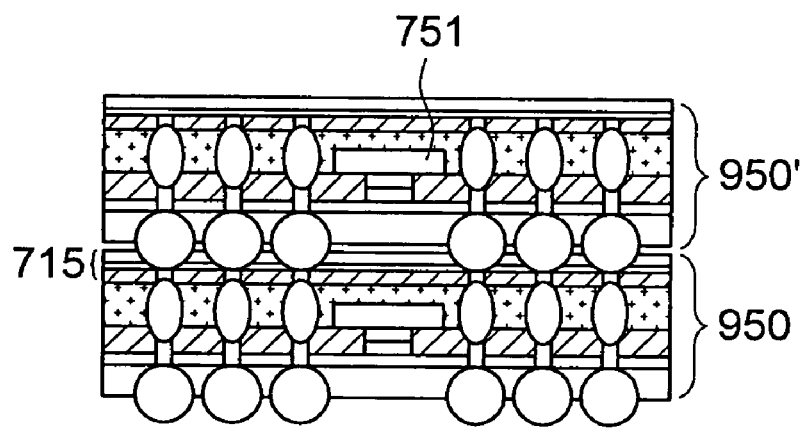

Next, as indicated in FIG. 7L, the first package portion 950' is disposed on the first package portion 950 to form a stackable chip package structure.

For the chip package structure disclosed in the present embodiment of the invention, the second terminal 773 of each internal conductor 770 is embedded into the adhering layer 727. After the adhering layer 727 is removed, the first terminal 771 and the second terminal 773 of each internal conductor 770 are exposed from the sealant 790. Thus, the chip package structure can form the distribution layers 710 and 715 without going through the grinding process, hence saving the grinding material and simplifying the method of manufacturing the chip package structure.

Despite the method of manufacturing the chip package structure is exemplified by forming two package portions at a time, anyone who is skilled in the technology of the invention will understand that the quantity of package portions is not for limiting the scope of protection of the invention. The manufacturing method of the invention can form one package portion, three package portions, ten package portions or even more package portions.

According to the chip package structure and the method of manufacturing the same disclosed in the above embodiments of the invention, the required thickness of package portions is reduced, and the package portions of different types can be stacked via the distribution layer. Thus, the volume of the chip package structure of the invention is five to six times smaller than that of multi-chip module (MCM) package structure. The chip package structure disclosed in the preferred embodiments of the invention can be used in flash random-access memory (RAM), static random-access memory (SRAM), dynamic random-access memory (DRAM), processor, application specific integrated circuit (ASIC) or controller. In addition, each package portion can be inspected before stacking so that the properties of each package portion can be inspected earlier.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A chip package structure, comprising:
a first package portion, comprising:
a first distribution layer having a first surface and a second surface;
a chip disposed on the first surface of the first distribution layer;
a plurality of internal conductors having a first terminal and a second terminal, wherein the first terminal is disposed on the first surface of the first distribution layer; and
a sealant disposed on the first surface of the first distribution layer for covering the chip and partly encapsulating the plurality of internal conductors, so that the first terminal and the second terminal of each of the plurality of internal conductors are exposed from the sealant, wherein the first terminal of each of the plurality of internal conductors is projected from the sealant, and the first distribution layer contacts the first terminal of each of the plurality of internal conductors; and
a plurality of first external conductors disposed on the second surface of the first distribution layer of the first package portion and electrically connected to the plurality of internal conductors, wherein the first distribution layer electrically connects the first terminal of each of the plurality of internal conductors to at least one of the plurality of first external conductors.

2. The chip package structure according to claim 1, further comprising:
a plurality of second external conductors disposed on the first package portion; and
a second package portion disposed on the first package portion, wherein the second package portion is electrically connected to the second terminal of each of the plurality of internal conductors via the plurality of second external conductors.

3. The chip package structure according to claim 2, wherein each of the plurality of second external conductors is connected to a corresponding one of the plurality of internal conductors.

4. The chip package structure according to claim 2, wherein the second package portion and the first package portion have the same size.

5. The chip package structure according to claim 2, wherein the first package portion further comprises a second distribution layer disposed on the sealant, and each of the plurality of second external conductors is electrically connected to the second terminal of at least one of the plurality of internal conductors by the second distribution layer.

6. The chip package structure according to claim 5, wherein the second distribution layer has a first surface and a second surface, the second terminal of each of the plurality of internal conductors is disposed on the second surface of the second distribution layer, and the plurality of second external conductors is disposed on the first surface of the second distribution layer.

7. The chip package structure according to claim 1, wherein the second terminal of each of the plurality of internal conductors is coplanar with the sealant.

8. The chip package structure according to claim 1, wherein the second terminal of each of the plurality of internal conductors is projected from the sealant.

9. The chip package structure according to claim 1, wherein a thickness of the sealant is at least equal to that of the chip.

10. A chip package structure, comprising:
a first distribution layer having a first surface and a second surface;
a second distribution layer;
a chip disposed on the first surface of the first distribution layer;
a plurality of internal conductors having a first terminal and a second terminal;
a sealant disposed on the first surface of the first distribution layer and between the first distribution layer and the second distribution layer, the sealant for covering the chip and partly encapsulating the plurality of internal conductors, so that the first terminal and the second terminal of each of the plurality of internal conductors are exposed from the sealant, wherein the first terminal and the second terminal of each of the plurality of internal conductors are projected from the sealant, the first distribution layer covers the first terminal of each internal conductor, and the second distribution layer covers the second terminal of each internal conductor; and a plurality of first external conductors disposed on the second surface of the first distribution layer and electrically connected to the plurality of internal conductors.

11. The chip package structure according to claim 10, further comprising a plurality of second external conductors disposed on the second distribution layer, wherein each of the plurality of second external conductors is electrically connected to at least one of the plurality of internal conductors.

12. The chip package structure according to claim 11, wherein the second distribution layer is disposed on the sealant, and each of the plurality of second external conductors is electrically connected to at least one of the plurality of internal conductors by the second distribution layer.

13. The chip package structure according to claim 11, wherein the second distribution layer has a first surface and a second surface, the second terminal of each of the plurality of internal conductors is disposed on the second surface of the second distribution layer, and the plurality of second external conductors are disposed on the first surface of the second distribution layer.

14. A chip package structure, comprising:
a first distribution layer having a first surface and a second surface, wherein the first distribution layer includes a first under bump metallurgy layer, a first polymer layer, and a first redistribution layer electrically connected to the first under bump metallurgy layer;
a chip disposed on the first surface of the first distribution layer;
a plurality of internal conductors having a first terminal and a second terminal, wherein the first terminal electrically connects to the first redistribution layer, and wherein the first under bump metallurgy layer physically contacts and is electrically connected to the plurality of internal conductors;

a sealant disposed on the first surface of the first distribution layer for covering the chip and partly encapsulating the plurality of internal conductors, so that the first terminal and the second terminal of each of the plurality of internal conductors are exposed from the sealant, wherein the first terminal of each of the plurality of internal conductors is projected from the sealant, and the first distribution layer covers the first terminal of each of the plurality of internal conductors; and a plurality of first external conductors covered by the first polymer layer and electrically connected to the plurality of internal conductors.

15. The chip package structure according to claim 14, wherein the second terminal of each of the plurality of internal conductors is coplanar with the sealant.

16. The chip package structure according to claim 14, wherein the second terminal of each of the plurality of internal conductors is projected from the sealant.

17. The chip package structure according to claim 14, wherein the first polymer layer is configured to provide electrical isolation between the plurality of first external conductors.

18. The chip package structure according to claim 14, further comprising a second distribution layer disposed on the sealant.

19. The chip package structure according to claim 18, wherein:
the second distribution layer is electrically connected to the first distribution layer by the plurality of internal conductors; and
the second distribution layer covers the second terminal of each of the plurality of internal conductors.

20. The chip package structure according to claim 18, wherein:
the second distribution layer includes a second under bump metallurgy layer, a second redistribution layer, and a second polymer layer; and
the second under bump metallurgy layer is electrically connected to the plurality of internal conductors and the second redistribution layer.

* * * * *